United States Patent
Ghosh Dastidar et al.

(10) Patent No.: US 7,571,413 B1
(45) Date of Patent: Aug. 4, 2009

(54) TESTING CIRCUITRY FOR PROGRAMMABLE LOGIC DEVICES WITH SELECTABLE POWER SUPPLY VOLTAGES

(75) Inventors: Jayabrata Ghosh Dastidar, San Jose, CA (US); Srinivas Perisetty, Santa Clara, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 226 days.

(21) Appl. No.: 11/478,148

(22) Filed: Jun. 28, 2006

(51) Int. Cl.
*G06F 17/50* (2006.01)
*H03K 19/173* (2006.01)

(52) U.S. Cl. .......................... 716/16; 326/37

(58) Field of Classification Search ............. 716/16–17, 716/4; 326/37–38; 714/725–726, 735
See application file for complete search history.

(56) References Cited

U.S. PATENT DOCUMENTS

| | | | |
|---|---|---|---|
| 4,439,858 A * | 3/1984 | Petersen | 714/734 |
| 5,572,717 A | 11/1996 | Pedersen | |
| 5,608,337 A | 3/1997 | Hendricks et al. | |
| 5,996,091 A * | 11/1999 | Jones et al. | 714/37 |
| 6,112,020 A | 8/2000 | Wright | |
| 6,167,364 A | 12/2000 | Stellenberg et al. | |
| 6,195,772 B1 | 2/2001 | Mielke et al. | |
| 6,481,000 B1 * | 11/2002 | Zaveri et al. | 716/17 |
| 6,550,038 B2 * | 4/2003 | Shirata | 716/4 |
| 6,668,237 B1 | 12/2003 | Guccione et al. | |
| 6,895,566 B1 * | 5/2005 | Chan et al. | 716/4 |
| 6,897,678 B2 * | 5/2005 | Zaveri et al. | 326/39 |
| 7,036,062 B2 * | 4/2006 | Morris et al. | 714/733 |
| 2003/0033584 A1 * | 2/2003 | Zaveri et al. | 716/17 |
| 2007/0285122 A1 * | 12/2007 | Si et al. | 326/38 |

* cited by examiner

*Primary Examiner*—Stacy A Whitmore
(74) *Attorney, Agent, or Firm*—Treyz Law Group; G. Victor Treyz; David C. Kellogg

(57) ABSTRACT

A programmable integrated circuit has multiple power supply voltages. Power supply voltages are distributed using power supply distribution lines. The integrated circuit has programmable power supply voltage selection switches. Each power supply voltage selection switch has its inputs connected to the power supply distribution lines and supplies a selected power supply voltage to a circuit block at its output. Test circuits are provided for testing the power supply voltage selection switches. During testing, the power supply voltage selection switches are adjusted to produce various power supply voltages at their outputs. The test circuit associated with each switch performs voltage comparisons to determine whether the switch is functioning properly. Each test circuit produces a test result based on its voltage comparison. The test results from the test circuits are provided to a scan chain, which unloads the test results from the integrated circuit to a tester for analysis.

17 Claims, 15 Drawing Sheets

TESTING CIRCUITRY FOR PROGRAMMABLE LOGIC DEVICES WITH SELECTABLE POWER SUPPLY VOLTAGES

BACKGROUND

This invention relates to programmable logic device integrated circuits, and more particularly, to testing programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices contain programmable memory elements. With one typical arrangement, a programmable logic device has an array of volatile memory elements based on random-access-memory (RAM). During device programming, memory elements in the array are loaded with configuration data. Memory elements that are loaded with configuration data in this way are sometimes referred to as configuration random-access-memory cells. Once loaded, each memory element produces a corresponding static output signal. The static output signals from the memory elements are applied to circuit components in the programmable logic.

The programmable logic generally uses complementary metal-oxide-semiconductor (CMOS) technology and includes components such as n-channel metal-oxide-semiconductor (NMOS) transistors and p-channel metal-oxide-semiconductor (PMOS) transistors. The states of the static output signals control the states of the transistors. In general, some of the static output signals produced by the memory elements will be high and some will be low. When, for example, a memory element applies a high output signal to the gate of an n-channel metal-oxide-semiconductor transistor, that transistor will be turned on. If a memory element applies a low output to the gate of the n-channel metal-oxide-semiconductor transistor, the transistor will be turned off. By configuring the programmable logic in this way, the configuration data in the programmable memory elements can be used to implement a logic designer's desired custom circuit design using the resources available on the programmable logic device.

Power consumption is a critical challenge for modern integrated circuits such as programmable logic device integrated circuits. Circuits with poor power efficiency place undesirable demands on system designers. Power supply capacity may need to be increased, thermal management issues may need to be addressed, and circuit designs may need to be altered to accommodate inefficient circuitry.

One way to improve power efficiency is to selectively body bias the NMOS and PMOS transistors on an integrated circuit. NMOS and PMOS transistors have four terminals—a drain, a source, a gate, and a body. The body terminal, which is sometimes referred to as the well or bulk terminal, can be biased to adjust transistor performance. For example, a positive bias voltage can be applied to the body of a PMOS transistor and a negative bias voltage can be applied to the body of an NMOS transistor. These bias voltages increase the effective threshold voltages of the transistors and thereby reduce their leakage currents. The reductions in leakage current that are achieved by applying these types of body bias voltages reduce power consumption, but can slow transistor switching speeds. It can therefore be advantageous to use different body bias voltages for different regions of a circuit. Portions of a device that require low power consumption can use one body bias level (i.e., a body bias level that increases transistor threshold voltages). Portions of the device that require maximum switching speed can use another body bias level (i.e., a body bias level that reduces transistor threshold voltages).

To provide different body bias voltages to various portions of an integrated circuit, a set of high and low body bias voltages may be distributed throughout the integrated circuit using power supply distribution paths. Power supply voltage selection switches may be used to select which body bias voltage is routed to each portion of the integrated circuit. In a programmable logic device, power supply selection switches may be controlled by associated memory elements. During device programming, configuration data is loaded into the memory elements that configures the power supply voltage selection switches. This allows portions of the device that require high performance to be provided with body bias voltages that enhance transistor switching speed, while those portions of the device that do not require high performance can be operated with body bias voltages that reduce power consumption.

Power consumption efficiency may also be improved by appropriate selection of other power supply voltages. For example, a device may be powered using a low power supply level (e.g., 1.1 volts or less) for much of its core logic. Lowering the core logic supply in this way will reduce power consumption. However, logic circuits that are powered in this way may not perform as well as desired. For example, NMOS pass transistors may not turn on as fully as would be desired if they are only powered using 1.1 volt logic signals. In this type of environment, it can be beneficial to selectively use elevated power supply voltages. Such elevated power supply voltage may, for example, be used for at least some of the memory elements on a device.

The power supply voltages used for powering the memory elements on a programmable logic device control the range of the static output signals produced by the memory elements when loaded with configuration data. For example, if a memory element is powered using a positive power supply voltage of 1.1 volts and is loaded with a configuration bit that has a logic one value, the memory element will produce an output signal at 1.1 volts. By using an elevated memory element power supply level, the output of a memory element containing a logic can be raised to an elevated level such as 1.6 volts. The elevated 1.6 volt signal level will turn on the NMOS pass transistor more fully than a 1.1 volt signal level and will thereby improve device performance.

In order to provide a logic designer with the ability to adjust power supply levels, a programmable logic device may be provided with multilevel power supply distribution paths. Such paths can distribute multiple power supply voltages to various portions of a device. For example, positive power supply levels such as 1.1 volts and 1.6 volts may be distributed over the power supply distribution paths and ground power supply levels of 0 volts and −1 volts may be distributed over the power supply distribution paths. Programmable power supply selection switches may be used to selectively tap into desired power supply voltages at various portions on a device.

Programmable power supply selection switches may be controlled by associated memory elements. By loading appropriate configuration data into the memory elements, a logic designer can configure some regions of an integrated circuit to use one set of power supply levels and other regions of the integrated circuit to use another set of power supply levels. By adjusting the power supply levels that are used, performance and power consumption tradeoffs can be made with a high level of granularity, thereby optimizing device performance.

Programmable logic devices are tested during manufacturing. Because improper selection of a power supply voltage with a power supply selection switch may cause a circuit design to perform inadequately, it would be desirable to be able to provide a way in which to test whether power supply selection switches on an integrated circuit are functioning properly.

SUMMARY

In accordance with the present invention, programmable integrated circuits are provided with multiple power supply voltages. Programmable power supply voltage selection switches are used to select appropriate power supply voltages to apply to circuit blocks on the integrated circuit. Some circuit blocks are powered using power supply voltages that enhance performance, whereas other circuit blocks are powered using power supply voltages that minimize power consumption.

During normal operation of the programmable integrated circuit, the programmable power supply voltage selection switches operate in accordance with configuration data that has been loaded into associated programmable memory elements. During testing, test configuration data is loaded into the memory elements. The test configuration data adjusts the power supply voltage selection switches. As the switches are being adjusted, test circuits are used to monitor the performance of the switches.

Each programmable power supply voltage selection switch may be provided with an associated test circuit. The test circuit associated with each switch compares the output of the switch to a particular one of the power supply voltages. The test circuits each produce a test result output bit that is conveyed to an associated register over a programmable interconnect path. The registers may be configured to form a scan chain.

Further features of the invention, its nature and various advantages will be more apparent from the accompanying drawings and the following detailed description of the preferred embodiments.

DETAILED DESCRIPTION

The present invention relates to testing integrated circuits that contain circuitry for selecting power supply voltages. The integrated circuits being tested may be programmable logic device integrated circuits or any other suitable integrated circuits. If desired, testing may be performed on programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and circuitry for selecting power supply voltages from multiple possible power supply voltage levels. The present invention will generally be described in the context of programmable logic device integrated circuits as an example.

Figure 1:
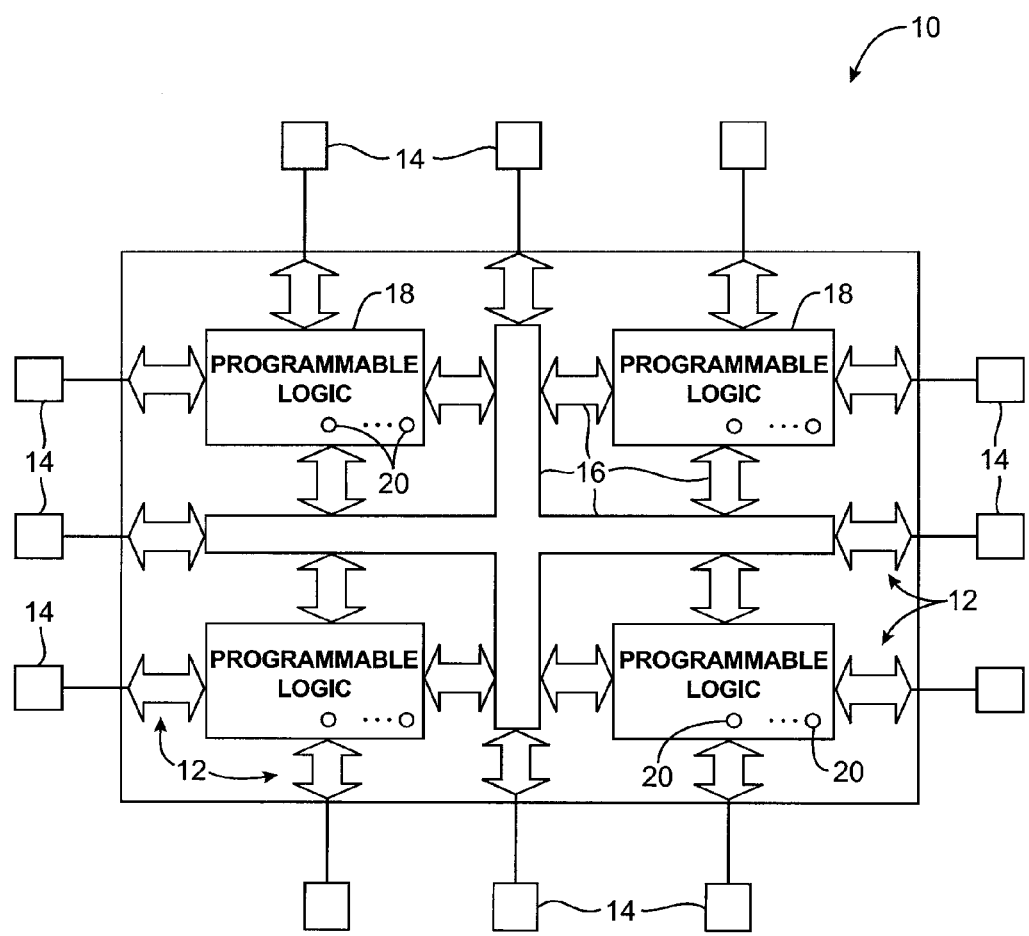
FIG. 1 is a diagram of an illustrative programmable logic device integrated circuit in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM, or programmable memory elements.

The programmable logic device 10 contains programmable power supply voltage selection switches that are controlled by control signals. The control signals may be external control signals received from a tester or other off-chip source, dynamic internal control signals, static control signals produced by memory elements 20, or any suitable combination of such signals.

The use of memory elements 20 to generate static control signals for controlling the programmable power supply voltage selection switches is described herein as an example. With this type of illustrative arrangement, the programmable power supply voltage selection switches are tested by loading test configuration data into the programmable elements 20 that are used to control the states of the switches. The programmable elements 20 that are used to control the states of the power supply selection switches are reprogrammable memory elements such as random-access-memory cells or electrically-erasable read-only-memory cells. By using reprogrammable memory elements (or other suitable control signals) to control the switches, the states of the switches may be switched back and forth during test measurements for thorough testing without permanently altering the state of the programmable logic device 10. This allows programmable logic device 10 to be non-destructively tested.

Memory elements 20 are loaded with configuration data via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include transistors in the power supply voltage selection switches, pass transistors, parts of multiplexers (e.g., multiplexers used for forming routing paths in programmable interconnects 16), look-up tables, logic arrays, AND, OR, NAND, and NOR logic gates, etc.

During normal operation, memory elements 20 are generally loaded with configuration data that is supplied from a configuration device integrated circuit. During testing, configuration data is generally loaded into memory elements 20 from a tester.

The circuitry of device 10 may be organized using any suitable architecture. As an example, the logic of programmable logic device 10 may be organized in a series of rows and columns of larger programmable logic regions each of which contains multiple smaller logic regions. The smaller regions may be, for example, regions of logic that are sometimes referred to as logic elements, each containing a four-input look-up table, one or more registers, and programmable multiplexer circuitry. The larger regions may be, for example, logic array blocks containing multiple logic elements.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
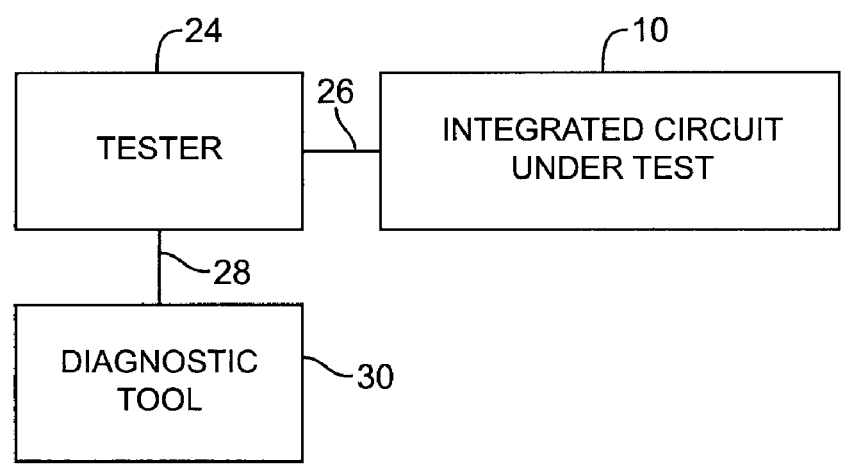
FIG. 2 is a diagram of an illustrative test environment in which programmable logic device integrated circuit selectable power supply voltage tests are performed in accordance with the present invention.

A system environment of the type that may be used during test operations is shown in FIG. 2. A programmable logic device integrated circuit 10 or other integrated circuit under test is connected to a tester 24 using test path 26. The device being tested, which is sometimes referred to as the device under test, may be an unpackaged integrated circuit such as a circuit in an undiced wafer or may be a packaged integrated circuit. Tester 24 has a test fixture for making electrical connections with the pins 14 of device 10 during testing.

To perform a test, tester 24 applies power to device 10 through power pins. Nominal power supply voltages may be applied or test power supply voltage levels may be used. Test configuration data is loaded into programmable memory elements 20 in device 10 through path 26. The configuration data configures the programmable logic of device 10 for testing. For example, the configuration data sets power supply voltage selection switches to certain settings, so that their proper operation can be verified. The configuration data also configures the programmable interconnects 16 of device 10 to form signal routing paths that are needed to route test data to appropriate capture locations. With one suitable approach, test signals are routed to scan chain registers. The scan chain registers capture the test results and, when unloaded, provide the results to tester 24 for analysis.

As tests are performed, device 10 uses internal test circuits to make measurements on power supply voltage levels. For example, device 10 may use a test circuit that compares a given power supply voltage to the voltage at the output of a power supply voltage selection switch. The results of this comparison form a digital data signal (i.e., a logic high or low signal) that is captured by a scan chain register. By analyzing the internal power supply voltages that are produced under various power supply selection switch settings, tester 24 can use the test circuits to determine whether the power supply selection circuitry is working properly. Test analysis may be performed externally. For example, test data can be provided to a diagnostic tool 30 via path 26, tester 24, and path 28. Tools such as tester 24 and tool 30 are typically implemented using computers loaded with testing software.

Figure 3:
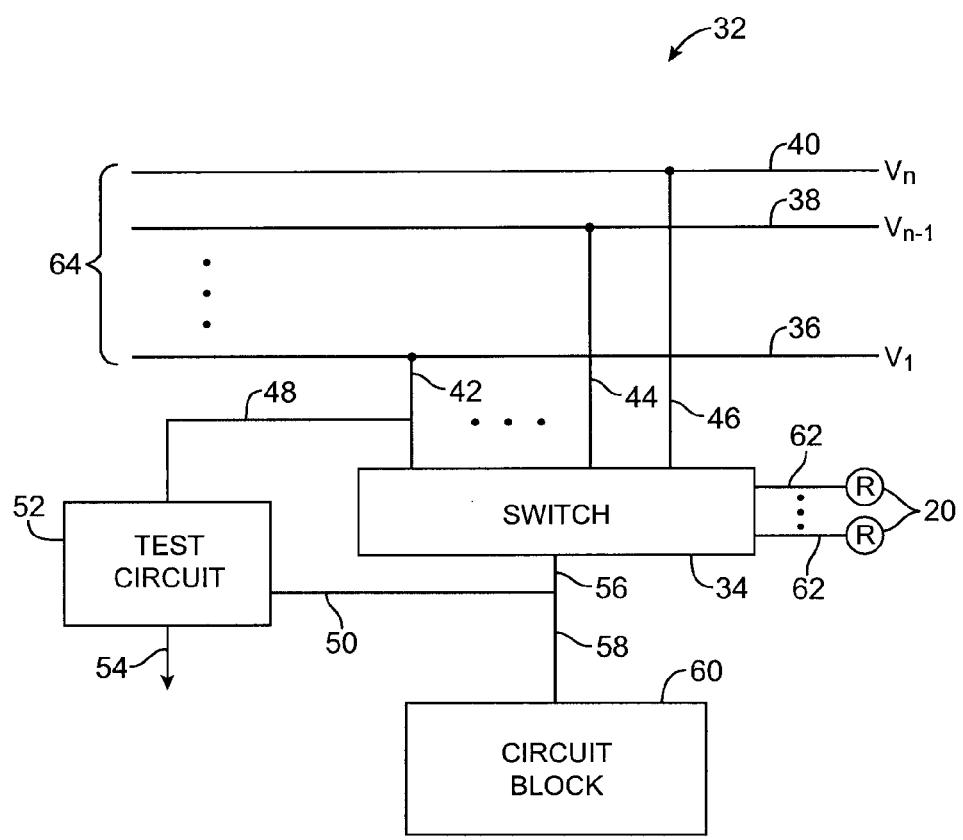
FIG. 3 is a diagram showing how test circuitry is used for monitoring whether a power supply voltage selection switch is operating properly in accordance with the present invention.

During testing, test circuits are used to monitor the power supply voltages that have been selected using a circuit arrangement of the type shown in FIG. 3. As shown in FIG. 3, an integrated circuit such as a programmable logic device integrated circuit 10 contains testing and voltage selection circuitry 32. Power supply voltages $V_1 \ldots V_{n-1}, V_n$ are supplied on a power distribution path 64 containing power distribution lines such as lines 36, 38, and 40. In general, there may be any suitable number of different power supply voltages distributed on paths such as path 64. For example, there may be two different positive power supply voltages (i.e., a normal level of 1.1 volts and an elevated level of 1.6 volts), two low power supply voltages (e.g., 0 volts and −1 volts for body biasing), or three or more different voltages. The voltages on the lines of path 64 are generally all different from each other.

Programmable power supply voltage selection switches such as switch 34 are used to select which of the available power supply voltages are used. Each selected power supply voltage is applied to an associated circuit block such as circuit block 60. Switch 34 may be a multiplexer formed from metal-oxide-semiconductor transistors or may be formed using any other suitable circuit components. Switch 34 has inputs that receive the power supply voltages from power supply distribution path 64 via branch conductors such as branch conductors 42, 44, and 46. Switch 34 is configured so that the power supply voltage on a selected one of the branch conductors is routed to the output 56 of switch 34. For example, switch 34 can be adjusted so that the voltage $V_1$ from power supply line 36 is routed to output 56 or can be adjusted so that the voltage $V_n$ from power supply line 40 is routed to output 56.

The selected power supply voltage on output 56 of switch 34 is routed to circuitry such as circuit block 60 over path 58. In a typical integrated circuit, there are tens, hundreds, or thousands of switches 34, each of which selects a desired power supply voltage to apply to a respective circuit block 60, which is one of tens, hundreds, or thousands of circuit blocks 60. Testing is performed using test circuits such as test circuit 52. In a typical device, there may be a test circuit 52 for each switch 34 and circuit block 60 (e.g., there may be tens, hundreds, or thousands of test circuits 52).

Each circuit block 60 may be a region of programmable logic 18 (e.g., a logic array block for which the selected power supply voltage may serve as a positive power supply rail, ground supply rail, or body bias voltage) or an array of memory elements 20 (e.g., configuration random-access-memory cells formed from cross-coupled inverters for which the selected power supply voltage may serve as the positive power supply rail, ground power supply rail, or body bias voltage). Circuit blocks 60 may also contain hardwired circuitry (e.g., a memory array, digital signal processing block, or other circuitry for which the selected power supply voltage may serve as a positive or ground power supply rail or body bias voltage). If desired, a given circuit block 60 may be associated with multiple switches to receive multiple selected power supply voltages (e.g., a selected positive power supply voltage and/or a selected ground power supply voltage and/or a selected body bias power supply voltage).

Each test circuit 52 monitors the operation of an associated switch. As shown in FIG. 3, test circuit 52 has two inputs 48 and 50 and an output 54. Input 48 is connected to branch conductor 42, which is connected to power supply line 36. Input 50 is connected to output 56. Test circuit 52 compares the voltages on inputs 48 and 50 and generates a corresponding output signal on output 54. The output signal on output 54 is preferably a digital value (e.g., a logic one or a logic zero), that indicates the relative magnitudes of the inputs 48 and 50.

By controlling the configuration data stored in memory elements 20, the switch 34 can be adjusted during testing. While switch 34 is adjusted, test circuit 52 compares the voltages on inputs 48 and 50. If, for example, switch 34 is configured so that the signal from branch conductor 42 is routed to its output 56, the voltage on inputs 48 and 50 will be the same and test circuit 52 will take output 54 to one value (e.g., a logic zero). If switch 34 is configured so that the signal from branch conductor 46 is routed to its output 56, the voltage on inputs 48 and 50 will not be the same and test circuit 52 will take output 54 to another value (i.e., a logic one). During testing, the digital output signals that are provided at the outputs 54 of the test circuits 52 are analyzed to determine whether the switches 34 are operating properly.

The test results that are provided at test circuit outputs such as test circuit output 54 of FIG. 3 may be gathered using any suitable technique. For example, test results may be gathered using a chain of registers. This type of arrangement is shown in circuitry 66 of FIG. 4.

Figure 4:
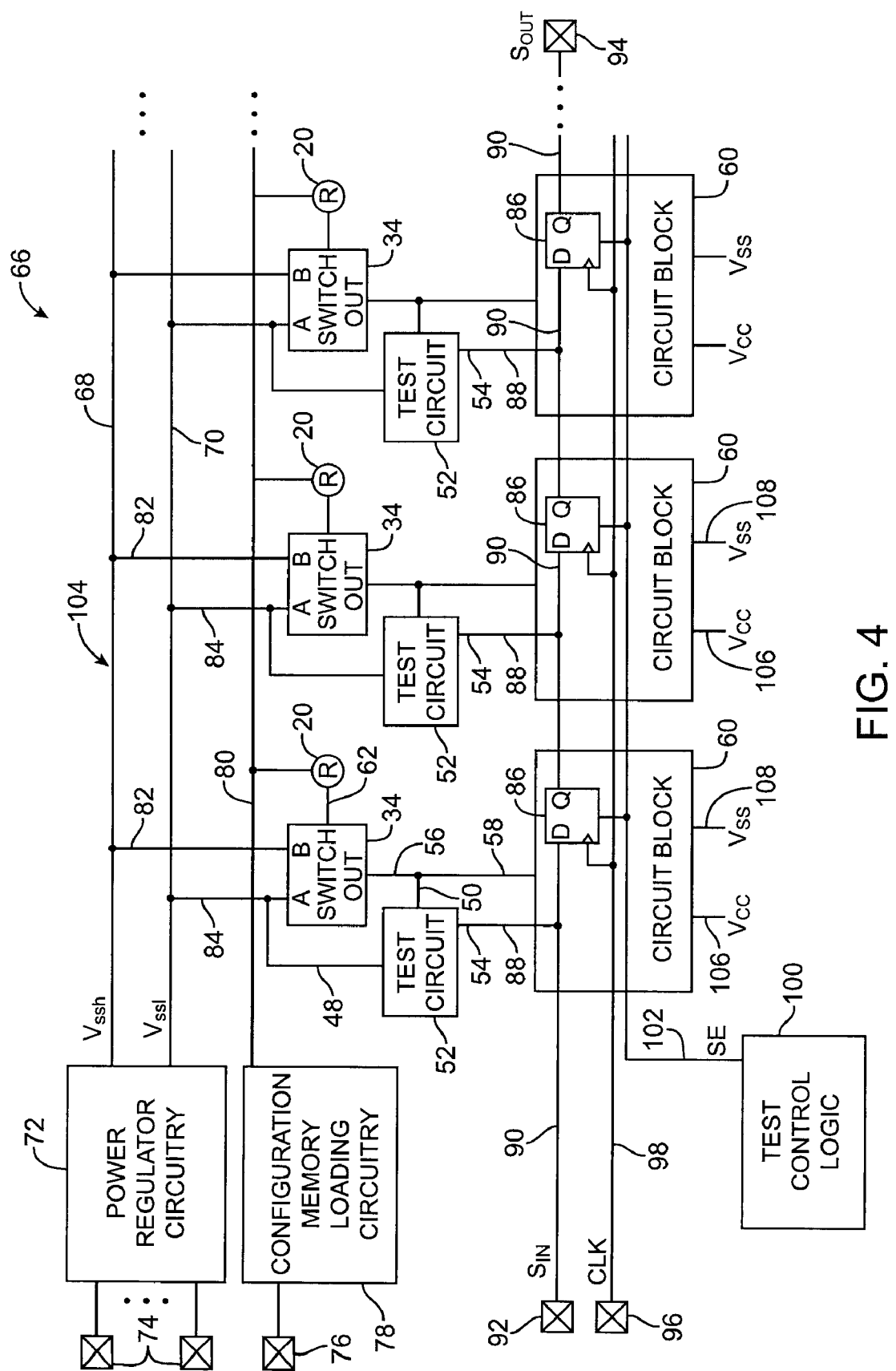
FIG. 4 is a diagram of an integrated circuit with illustrative test circuitry for monitoring whether a power supply voltage selection switch is operating properly in accordance with the present invention.

In the example of FIG. 4, there are two power supply voltage distribution lines 68 and 70. Power is supplied to power supply line 70 at a relatively low voltage Vssl (e.g., −1 volts). Power is supplied to power supply line 68 at a higher voltage Vssh (e.g., 0 volts). Power supply voltage such as Vssl and Vssh may be used as body bias voltage for metal-oxide-semiconductor transistors in circuit block 60 (as an example). The use of power supply voltages Vssl and Vssh as body bias voltages is merely illustrative. As described in connection with FIG. 3, there may be any suitable number of different power supply voltages at the inputs to the power supply voltage selection switches and the selected power supply voltage may be used for any suitable power supply function.

The power supply voltages Vssl and Vssh are provided to lines 68 and 70 in power supply distribution path 104 using power regulator circuitry 72 and pins 74. Power supply voltages may be passed directed from pins 74 to lines 68 and 70 or power regulator circuitry 72 may generate one or more different power supply voltages for lines 68 and 70. Power regulator circuitry 72 may, for example, generate smaller voltages from larger voltages using a voltage divider. Charge pump circuitry may be included in power regulator circuitry 72 if it is desired to create larger power supply voltages from smaller voltages provide at pins 74. A combination of these approaches may also be used. Power regulator circuitry 72 or an external pin may be used to supply other power supply voltages to circuitry 66. For example, pins or power regulator circuitry may be used to supply a positive power supply voltage Vcc (e.g., 1.1 volts or a selectable value) and a ground power supply voltage (e.g., 0 volts or a selectable value) to circuit blocks 60 using lines 106 and 108.

Each power supply voltage selection switch 34 has two inputs and an output. The input of each switch 34 that is labeled "A" is connected to the Vssl line via an associated branch conductor 84. Branch conductors 82 are used to convey the voltage Vssh from line 68 to the inputs labeled "B". The state of each switch 34 is determined by the contents of an associated memory element 20. When the memory element associated with a switch 34 contains one value (e.g., a logic high), the "A" input of the switch is connected to the switch's output 56. When the memory element associated with a switch 34 contains the opposite value (e.g., a logic low), the "B" input of the switch is connected to the switch's output 56.

The memory elements 20 that control the states of the switches 34 are loaded using configuration data loading paths such as path 80. Configuration data is supplied at pin 76 from a tester (during testing) or from a configuration device (during normal operation). Configuration memory loading circuitry 78 loads the configuration data into memory elements 20 (which are typically organized in the form of an array), thereby configuring switches 34.

During testing, test circuits 52 compare the voltages on inputs 48 and 50 and produce corresponding digital test result signals on outputs 54. Programmable interconnects 16 are configured to form paths 88, which route the signals from the outputs 54 into corresponding registers 86. With one suitable arrangement, circuit blocks 60 are logic array blocks and the registers 86 are contained within logic elements in the logic array blocks. This is merely illustrative. In general, any suitable arrangement may be used to store the digital test results data presented at the outputs 54 of the test circuits.

With the arrangement shown in FIG. 4, the registers 86 can be configured to form a scan chain. Scan chains are used to load data and capture test results during testing. The scan chain of FIG. 4 is formed using scan chain paths 90 (e.g., paths formed using hardwired and/or programmable interconnects), which link each register's data output Q to the data input D of a succeeding register in the chain. Test data can be loaded into registers 86 using scan in data pin 92. Test data can be unloaded from registers 86 using scan output pin 94. Each register 86 has a clock input that receives a clock signal CLK. The signal CLK may be provided to the registers 86 using a clock input pin 96 and clock distribution path 98.

Test control logic 100 controls the operation of the scan chain registers 86. The test control logic 100 provides a scan enable signal SE to each register 86 via scan enable path 102. The signal SE can be either high or low to enable or disable scan mode, respectively. During data capture operations, the value of SE is low, scanning is disabled, and test data is captured from all of the test circuits 52 in parallel. The digital test results data on the output 54 of each test circuit 52 is conveyed to a respective register 86 over an associated path 88. A switch that is controlled by a control signal from test control logic 100 or other suitable circuitry may be used in each path 88 to selectively connect the outputs 54 to the inputs of registers 86 during data capture operations. When the clock signal CLK transitions, the test data is clocked into the registers. Following data capture operations, test control logic 100 takes the signal SE high. This places the registers 86 into scan mode, so that a registers 86 form a scan chain (i.e., a shift register having its output connected to scan out pin 94). The clock signal CLK is then cycled repeatedly. The captured data is shifted out of the scan chain through pin 94 for analysis by tester 24 (FIG. 2).

Figure 5:
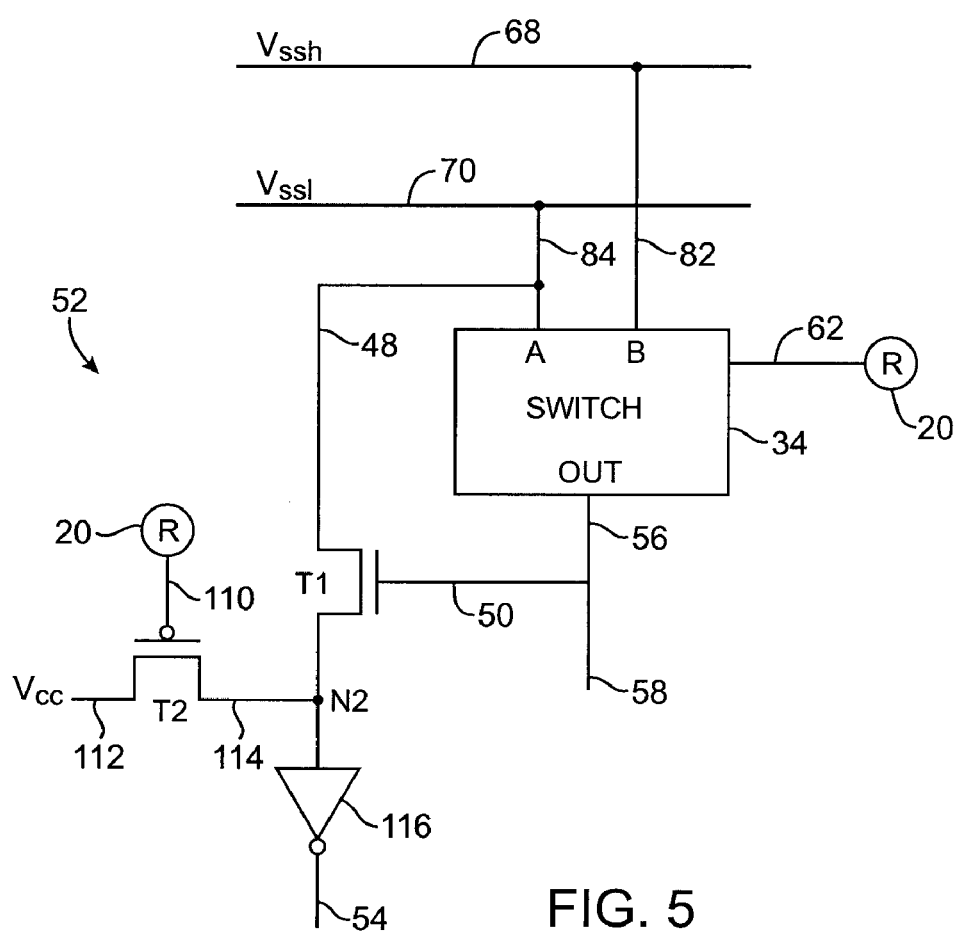
FIG. 5 is a diagram of an illustrative test circuit that tests the voltages produced when using a power supply voltage selection switch on an integrated circuit such as a programmable logic device integrated circuit in accordance with the present invention.

An illustrative test circuit 52 that may be used for testing the selectable power supply voltage circuitry of FIG. 4 is shown in FIG. 5. As shown in the example of FIG. 5, test circuit 52 has n-channel metal-oxide-semiconductor transistor T1 and p-channel metal-oxide-semiconductor transistor T2. The gate of transistor T2 is connected to ground or a programmable memory element 20 via path 110. When a memory element 20 is used to control transistor T2 as shown in the FIG. 5, the test circuit can be inactivated during normal operation.

The source and drains of metal-oxide-semiconductor transistors are often referred to collectively as "source-drain" terminals. As shown in FIG. 5, source-drain terminal 112 of transistor T2 is connected to positive power supply voltage Vcc (e.g., 1.1 volts). Source-drain terminal 114 of transistor T2 is connected to node N2.

Transistor T1 has its gate connected to line 50. One of the source-drain terminals of transistor T1 is connected to line 48 and receives the low power supply voltage Vssl from line 70 via path 84. The other source-drain terminal of transistor T1 is connected to node N2.

Output logic such as inverter 116 is used to drive the signal N2 out of test circuit 52 onto line 54. When the output logic is an inverter such as inverter 116, the signal on line 54 is inverted with respect to the signal on node N2. For example, if the voltage on node N2 is low, the digital output on line 54 is a logic high.

During testing, configuration data is loaded into memory element 20 that adjusts the state of switch 34. Test data is preferably gathered using both the A setting and B setting of switch 34. If the results are the same for both settings, or if other anomalous readings are gathered, it can be concluded that the switch 34 is not functioning properly and appropriate actions can be taken. For example, if one or more switches 34 are detected as functioning improperly, the device under test can be repaired or discarded.

In the example of FIG. 5, the voltages Vssl and Vssh are −1 volts and 0 volts, respectively. When switch 34 is adjusted to connect input A to its output, the voltage on line 48 will be −1 and the voltage on line 56 will be −1. With the voltage on the drain-source terminal of T1 that is connected to line 48 at −1, a voltage of −1 on its gate is insufficient to turn on transistor T1. As a result, transistor T1 is off. During testing, a logic zero is stored in the memory element controlling transistor T2 (or line 110 is connected directly to ground), so the voltage on line 110 is low, turning on transistor T2. Transistor T2 is configured as a weak pull-up circuit, so with T1 off and T2 on, node N2 is connected to voltage Vcc on line 112. This pulls node N2 high. The inverter 116 inverts the high signal on node N2 so that the output signal on test circuit output line 54 is low (i.e., a voltage Vss of 0 volts).

When switch 34 is adjusted to connect input B to the output 56, the voltage on line 56 will be 0. The voltage on line 48 will be −1. With the voltage on the drain-source terminal of T1 that is connected to line 48 at −1 and a voltage of 0 volts on the gate of transistor T1, transistor T1 is turned on. The transistor T1 is sized appropriately to ensure that transistor T1 is stronger than transistor T2 (e.g., taking into consideration whether T1 is NMOS or PMOS and taking into account the relative widths of the transistors T1 and T2). Accordingly, when transistor T1 is turned on, the −1 volt signal on line 48 is driven onto node N2 and overcomes the high voltage of Vcc to which weak pull-up transistor T2 would have otherwise pulled node N2. Inverter 54 inverts the low (about −1 volt) voltage on node N2 and produces a logic high signal on output 54 (i.e., a voltage Vcc of 1.1 volts).

Figure 6:
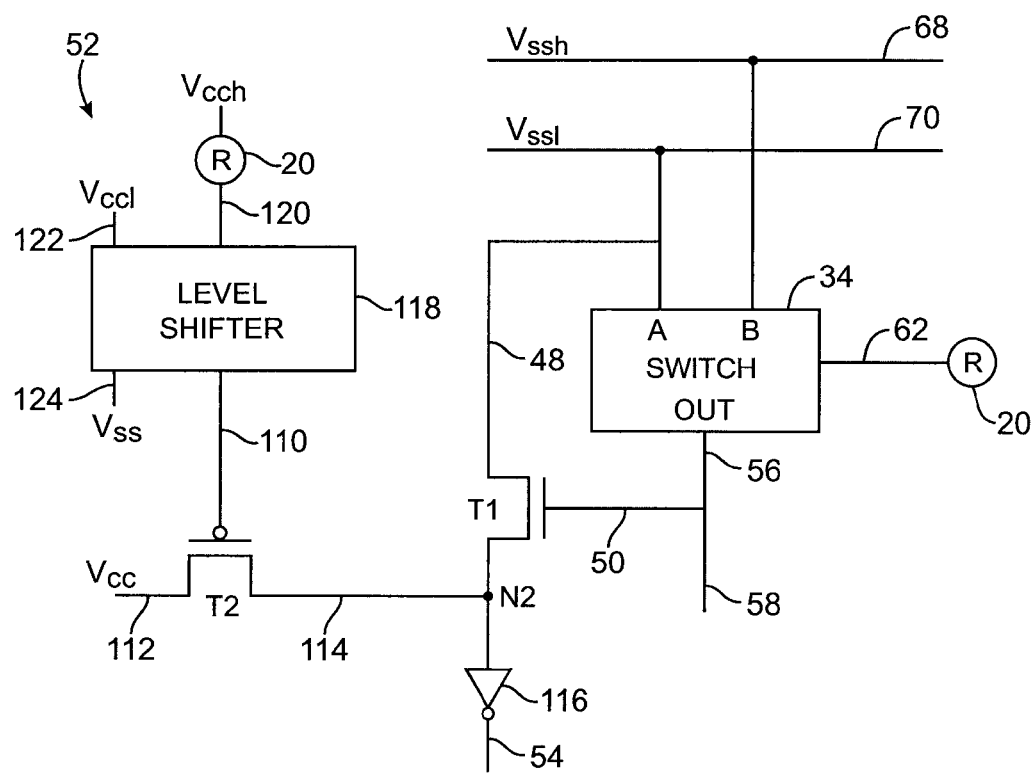
FIG. 6 is a diagram of an illustrative test circuit that incorporates a level shifter and that tests the voltages produced when using a power supply voltage selection switch on an integrated circuit such as a programmable logic device integrated circuit in accordance with the present invention.

To ensure that transistor T2 is weaker than transistor T1, it may be desirable to reduce the gate voltage applied on line 110. This may be accomplished by using a level shifter 118, as shown in FIG. 6. In the example of FIG. 6, the memory element 20 that is controlling transistor T2 is powered using an elevated power supply voltage Vcch (e.g., 1.6 volts). To enable testing, this memory element is loaded with a logic one, so the voltage on line 120 is 1.6 volts. Level shifter 118 reduces the voltage of the 1.6 volt signal on line 120 before this signal is applied to the gate of transistor 110.

As shown in FIG. 6, level shifter 118 may be powered using a positive power supply voltage Vccl (e.g., 1.1 volts) supplied at terminal 122 and a ground voltage Vss (e.g., 0 volts) supplied at terminal 124. When the input of level shifter 118 on line 120 is at 1.6 volts, the output of level shifter 118 on line 110 is 1.1 volts (Vccl) and transistor T2 is off. This disables testing. When the input of level shifter 118 on line 120 is at 0 volts, the output of level shifter 118 on line 110 is at about 0.7 volts and transistor T2 is weakly on. This allows transistor T2 to serve as a weak pull-up transistor and allows testing to be performed using transistor T1, as described in connection with FIG. 5.

Figure 7:
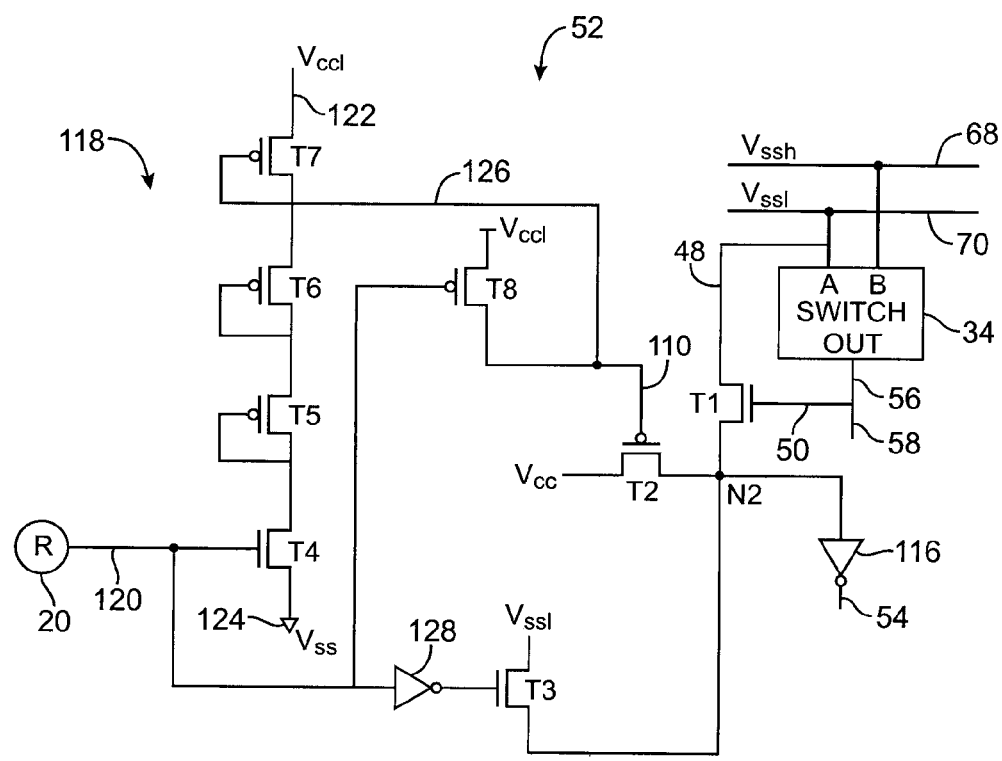
FIG. 7 is a diagram of an illustrative test circuit that incorporates a level shifter and a pull-up circuit that reduces leakage current and that tests the voltages produced when using a power supply voltage selection switch on an integrated circuit such as a programmable logic device integrated circuit in accordance with the present invention.

An illustrative level shifter 118 that may be used in the test circuit 34 is shown in FIG. 7. During testing, the memory element 20 that is connected to the gate of transistor T4 provides a high voltage (e.g., 1.6 volts), which turns on transistor T4. With transistor T4 on, diode-connected transistors T5, T6, and T7 serve as forward-biased diodes. Line 126 is used to tap a node that lies between transistors T7 and T6 and which therefore has a voltage of about 0.7 volts (i.e., about ⅔ of Vccl). This reduced positive power supply voltage is applied to line 110 and weakly turns on transistor T2, as described in connection with FIG. 6.

Transistor T8 is controlled by the voltage on line 120. During testing, line 120 is high and transistor T8 is off. During normal operation, line 120 is low and transistor T8 is on. With transistor T8 on, the voltage on the gate of transistor T2 is pulled high to Vccl. This turns off transistor T2, so that transistor T2 does not consume power.

Power consumption can be reduced during normal operation by ensuring that the signal produced on node N2 is either high or low and does not have an intermediate voltage (e.g., an intermediate voltage such as 0.7 volts when Vcc is 1.1 volts and Vss is 0 volts). If the signal on node N2 were to have an intermediate voltage, inverters in the path between node N2 and its corresponding register 86 would consume undesirably large amounts of power. This is because neither of the transistors in the inverters would be fully turned off.

The circuit arrangement of FIG. 7 uses pull-up transistor T3 to reduce power consumption by the test circuit 52 during normal operation of the integrated circuit. During normal operation, the voltage on line 120 is low. Inverter 128 inverts the low voltage on line 120 and applies a high voltage to the gate of transistor T3. This turns on transistor T3. With transistor T3 turned on, the voltage on node N2 is pulled low and remains low during all normal operations of the integrated circuit. Power consumption due to an intermediate voltage on node N2 is eliminated.

Figure 8A:
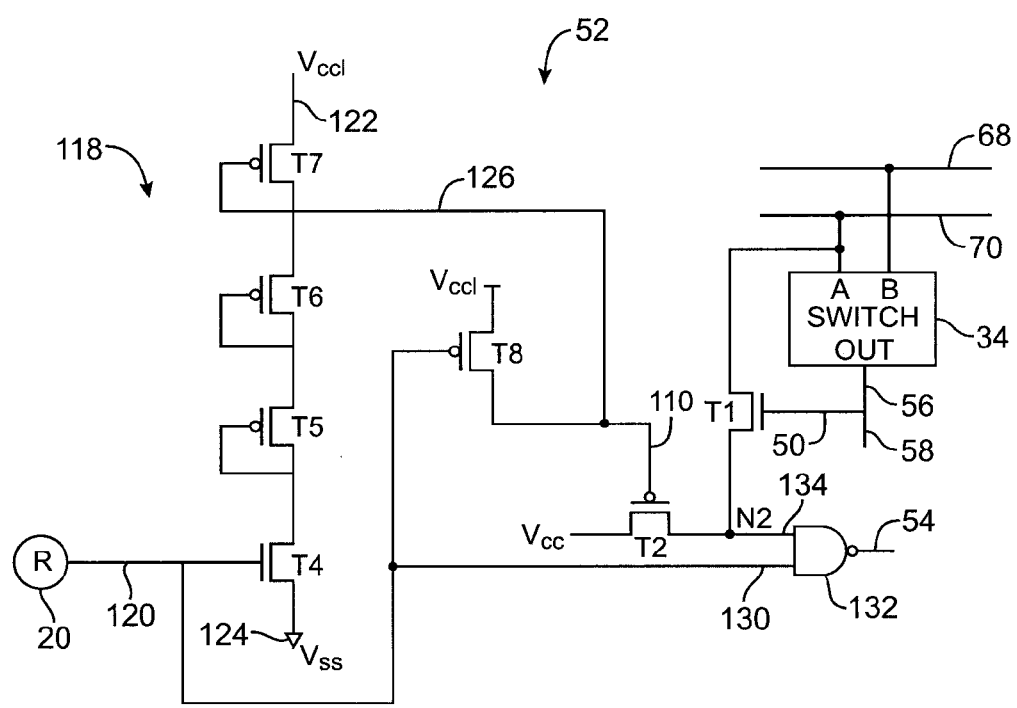
FIG. 8A is a diagram of an illustrative test circuit that incorporates a level shifter and NAND logic that reduces leakage current and that tests the voltages produced when using a power supply voltage selection switch on an integrated circuit such as a programmable logic device integrated circuit in accordance with the present invention.

Another approach for reducing unnecessary power consumption by the test circuit 52 during normal operation of device 10 uses NAND gates. A test circuit 52 that uses a NAND gate approach to reducing power consumption is shown in FIG. 8A. As shown in FIG. 8A, the transistor T3 of FIG. 7 is not used. Rather, the voltage on line 120 is provided to input 130 of NAND gate 132. Input 134 of NAND gate 132 receives the voltage on node N2. During testing, the signal on line 120 is high. With the signal on line 120 high, NAND gate 120 serves as an inverter such as inverter 116 of FIGS. 5, 6, and 7. During normal operation, the signal on line 120 is low. With the voltage on input 130 low, the output of NAND gate 132 is always high.

The transistors in test circuits 52 that are exposed to high voltages preferably use thick gate oxides to prevent damage. For example, in the arrangement of FIG. 8A, transistors T1 and T2 can be subjected to voltages of 2.1 volts, so transistors T1 and T2 are preferably thick oxide (e.g., 2.5 volt) devices. Transistors with thicker gate oxides are better able to withstand large voltages, but exhibit increased values of threshold voltage Vt and lower drain currents IDsat.

Figure 8B:
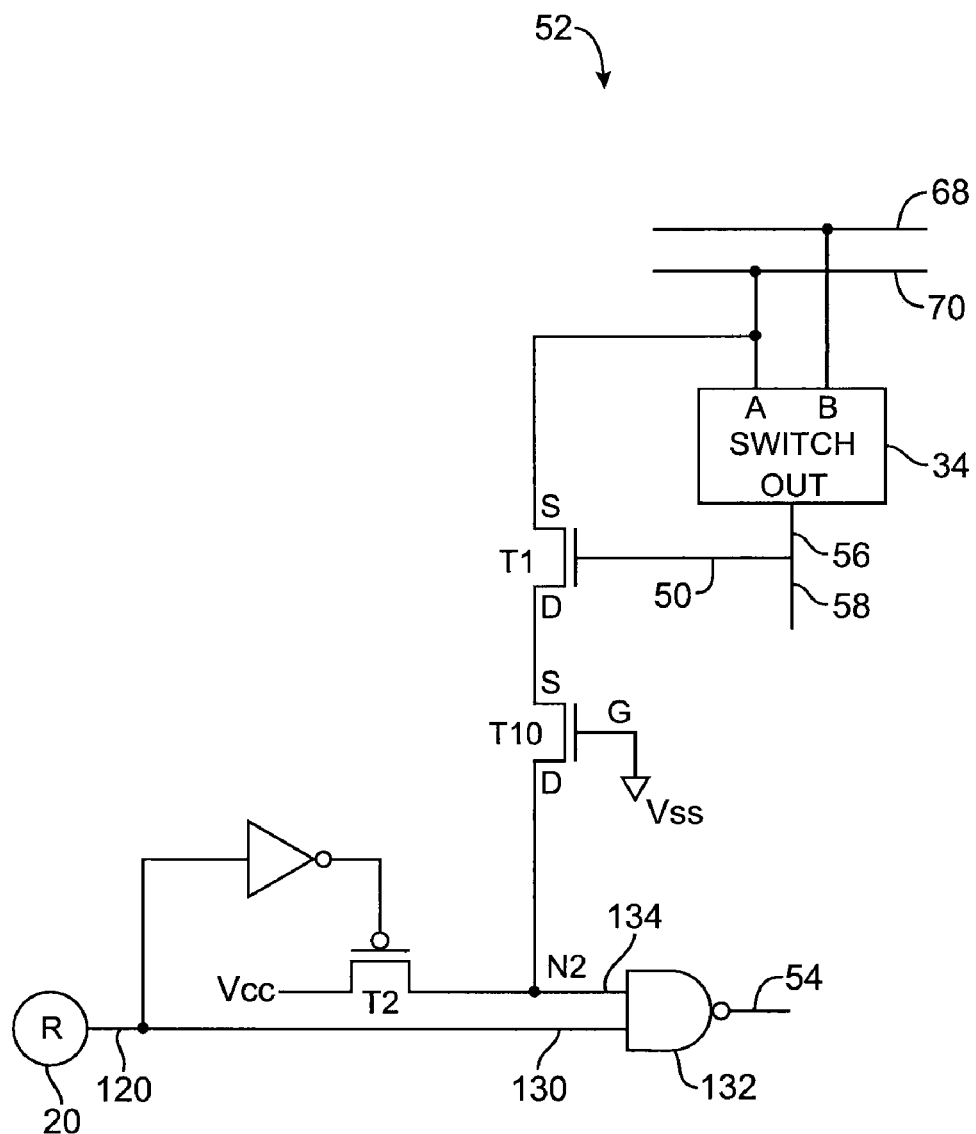
FIG. 8B is a diagram of an illustrative test circuit that incorporates NAND logic that reduces leakage current and that tests the voltages produced when using a power supply voltage selection switch on an integrated circuit such as a programmable logic device integrated circuit in accordance with the present invention.

Another suitable arrangement for circuit 52 is shown in FIG. 8B. In the arrangement of FIG. 8B, transistor T10 is used to improve the drive of transistor T1. The level shifter circuitry 118 of FIG. 8A is not used.

As shown in FIG. 8B, the source of transistor T10 is connected to the drain of transistor T1, the drain of transistor T10 is connected to node N2, and the gate of transistor T10 is connected to Vss. Transistor T10 prevents the drain of transistor T1 from rising above about −0.6 volts. As a result, the voltage across the terminals of transistor T1 does not exceed about 1.0 volts. Transistors T2 and T10 are preferably thick oxide (e.g., 2.5 volt) devices, but transistor T1 can be a lower-threshold thin-oxide device. This helps ensure that transistor T1 is significantly stronger than transistor T2, so that the level shifter circuitry 118 of FIG. 8A is not needed to weaken transistor T2. When transistor T1 is on, the source of transistor T10 is at −1.0 volts, the gate-source voltage Vgs across transistor T10 is 1.0 volts, and transistor T10 is fully on. A benefit of the FIG. 8B circuitry is that if the change in Vgs across transistor T1 were to be reduced (to allow a smaller voltage range to be used for testing—i.e., Vssh=0.5 volts), the voltage across transistor T10 is not reduced from 1.0 volts. The thick-oxide transistor T10 is therefore fully on and receives a full Vgs.

Figure 9:
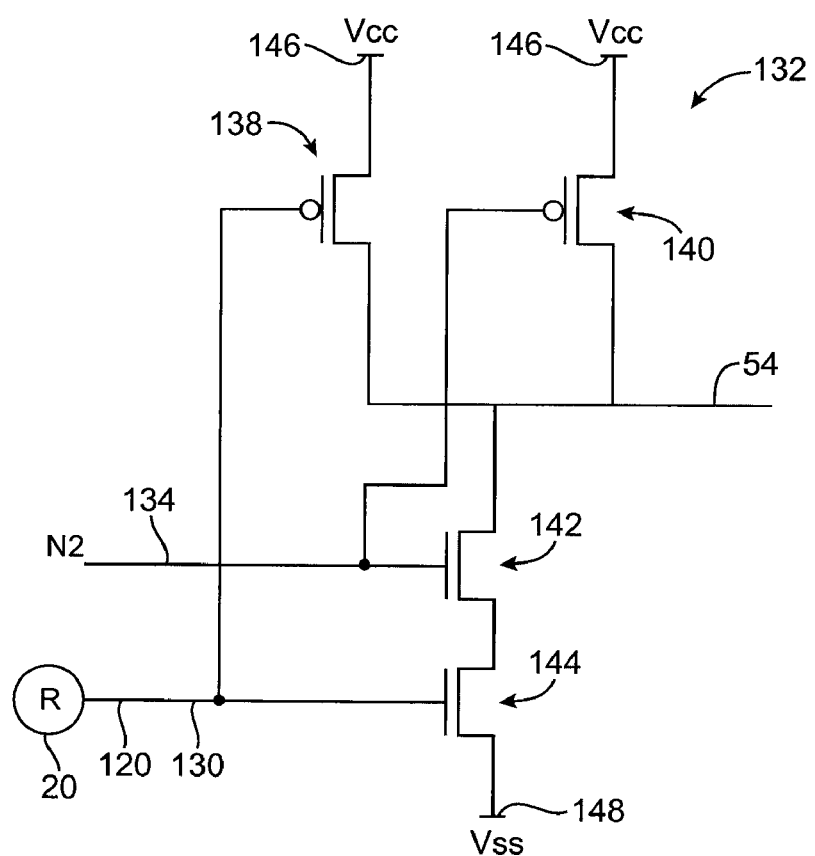
FIG. 9 is a diagram of an illustrative NAND gate that may be used in reducing leakage currents in selectable power supply voltage test circuitry in accordance with the present invention.

An illustrative NAND gate 132 is shown in FIG. 9. The NAND gate 132 has two PMOS transistors 138 and 140 and two NMOS transistors 142 and 144. NAND gate 132 is powered using a positive power supply voltage Vcc (e.g., 1.1 volts) and a ground voltage Vss (e.g., 0 volts). During normal operation of device 10, when no testing of the power supply voltage selection switch 34 is being performed, the input on line 130 is low, transistor 138 is on, and transistor 144 is off. With transistor 138 on, the output signal on line 54 is always high at Vcc and does not have an intermediate voltage level. Because transistor 144 is off, no current flows through the NAND gate between Vcc terminals 146 and Vss terminal 148, regardless of the voltage on node N2.

Figure 10A:
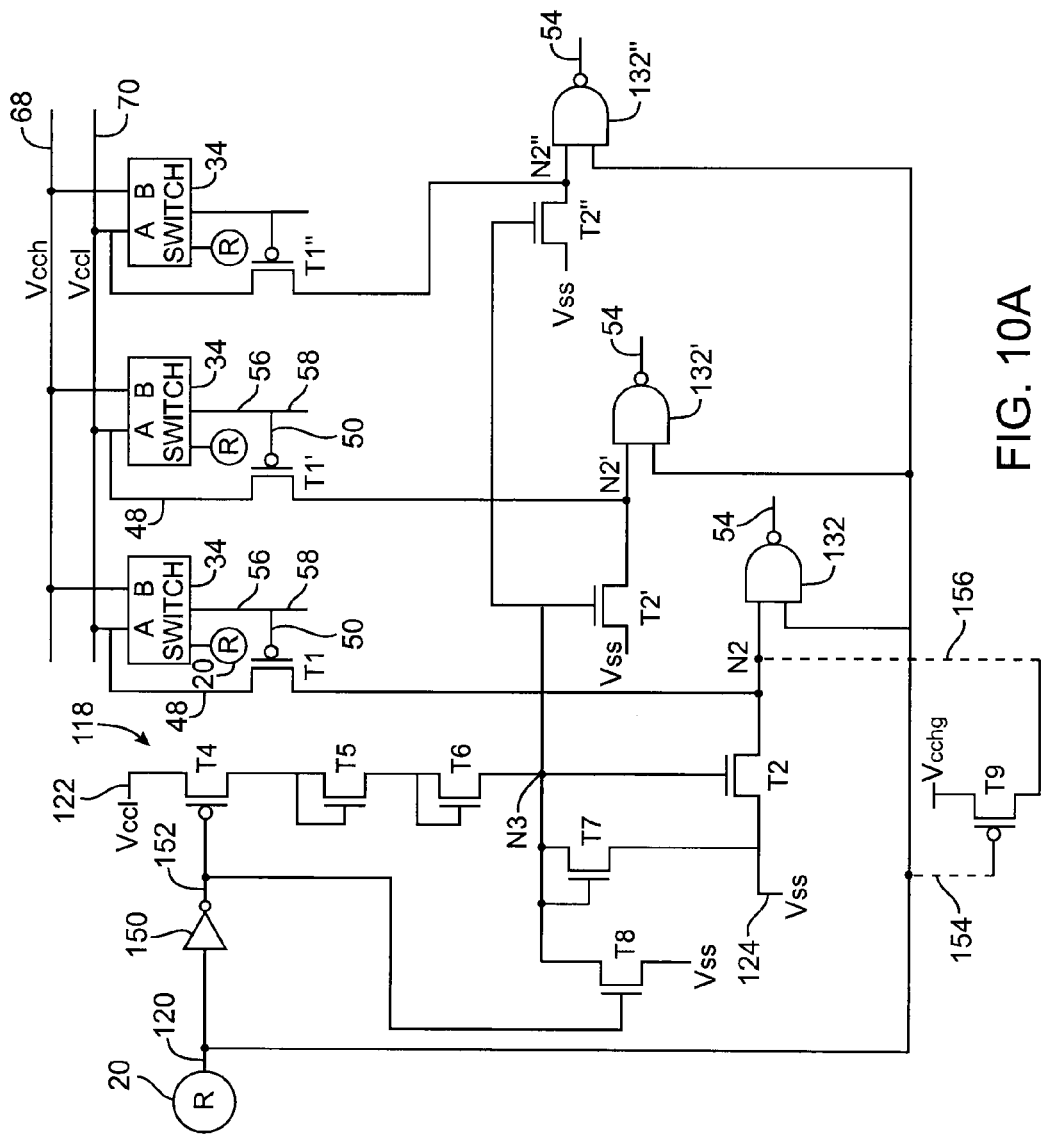
FIG. 10A is a diagram of an illustrative test circuit that incorporates a level shifter and leakage current reduction circuitry and that tests the voltages produced when using three power supply voltage selection switches on an integrated circuit such as a programmable logic device integrated circuit in accordance with the present invention.

Test circuitry that is suitable for measuring the performance of power supply voltage selection switches 34 that are selecting among positive power supply voltages is shown in FIG. 10A. In the example of FIG. 10A, power supply line 68 has a voltage Vcch (e.g., a voltage of 1.6 volts) and power supply line 70 has a voltage of Vssl (e.g., a voltage of 1.1 volts). Because the power supply voltage on lines 68 and 70 are positive, the polarity of transistors T1 and T2 are reversed with respect to the transistors T1 and T2 in circuits such as the circuit of FIG. 8A. In particular, the transistor T1 is a PMOS transistor and the transistor T2 is an NMOS transistor. Similarly, the transistors used in the level shifter 118 have reversed polarities. Transistor T4 is a PMOS transistor and transistors T5, T6, T7, and T8 are NMOS transistors.

There are three switches 34 and three associated test circuits in the example of FIG. 10A. Level shifter 118 may be shared between the test circuits. The first test circuit of FIG. 10A uses the level shifter 118, transistor T1, transistor T2, and NAND gate 132. The second test circuit of FIG. 10A uses the level shifter 118, transistor T1', transistor T2', and NAND gate 132'. The third test circuit of FIG. 10A is formed from the level shifter 118, transistor T1", transistor T2", and NAND gate 132".

During testing, the memory element 20 that is connected to line 120 takes line 120 high. The high signal on line 120 is inverted by inverter 150, taking line 152 low. With line 152 low, transistor T4 is turned on and transistor T8 is turned off. This allows current to flow from terminal 122 to terminal 124 through the diodes formed by diode-connected transistors T5, T6, and T7. The diodes T5, T6, and T7 form a voltage divider. If the voltage Vcc1 at terminal 122 is 1.1 volts, the voltage at node N3 will be about ⅓ of Vcc1 (i.e., about 0.35 volts). Because the voltage at node N3 is relatively small, pull-down transistors T2, T2', and T2" will be weakly turned on. This ensures that transistors T1, T1', and T1" will be able to successfully drive signals onto nodes N2, N2', and N2" during testing.

During normal operation, the memory element that is connected to line 120 takes line 120 low. The low signal on line 120 is inverted by inverter 150 and produces a high signal on line 152. The high signal on line 152 turns off transistor T4, so that no current flows through the diode stack in the level shifter. Transistor T8 is turned on, which pulls node N3 low. With node N3 low, transistors T2, T2', and T2" are all off.

Power consumption can be reduced by connecting NAND gates 132 to line 120 and nodes N2, N2', and N2", as described in connection with FIG. 9. Alternatively, circuits such as the circuit formed by transistor T9 and dotted line paths 154 and 156 can be used. With this type of arrangement, transistor T9 is turned on when line 120 is pulled low during normal operation. When transistor T9 turns on, node N2 is pulled to a high value, so that power loss due to intermediate voltages on node N2 are eliminated. The same type of pull-up circuit can be connected to nodes N2' and N2".

Figure 10B:
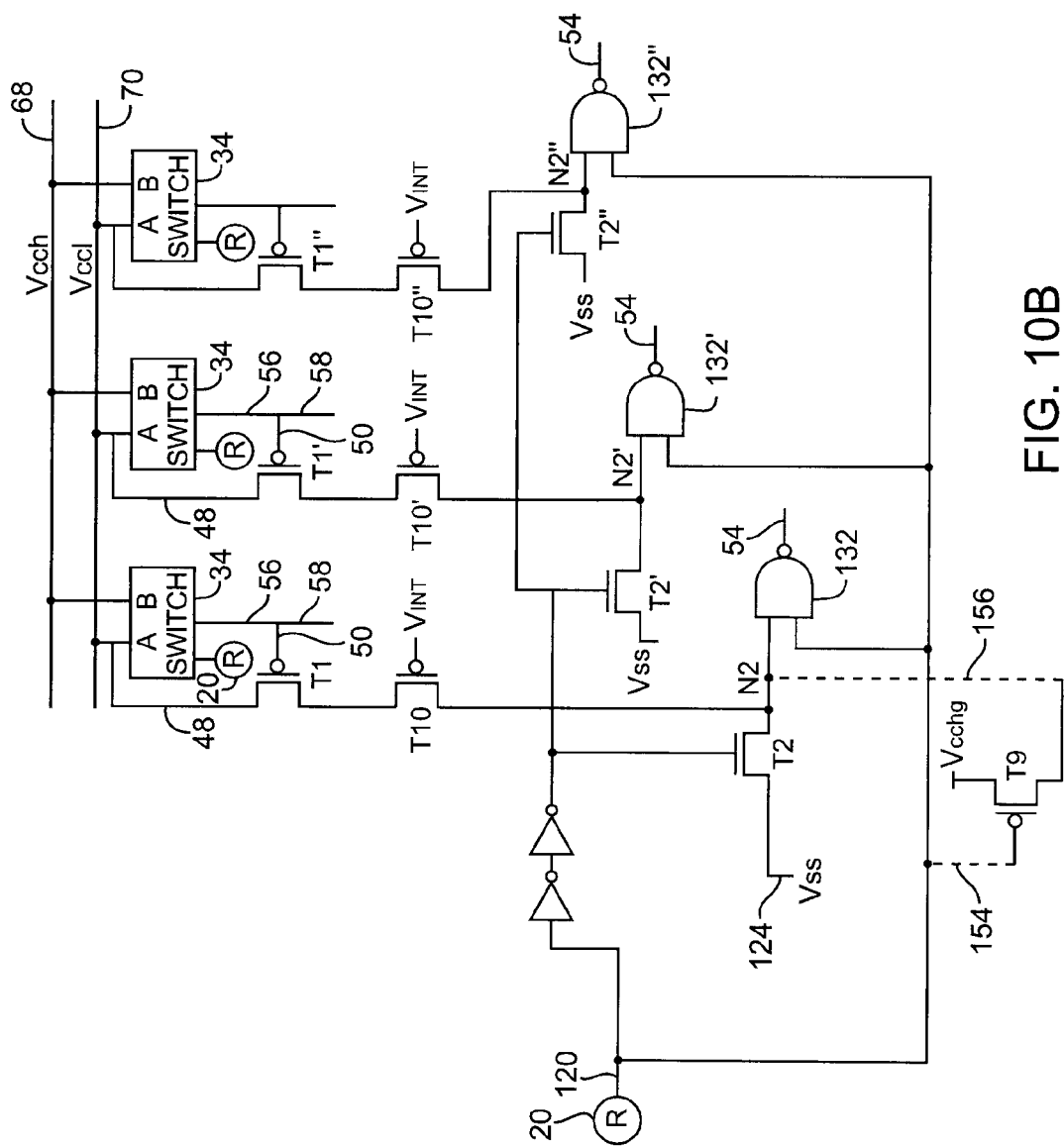
FIG. 10B is a diagram of an illustrative test circuit that incorporates leakage current reduction circuitry and that tests the voltages produced when using three power supply voltage selection switches on an integrated circuit such as a programmable logic device integrated circuit in accordance with the present invention.

FIG. 10B shows an illustrative arrangement in which the level shifter 118 of FIG. 10A is not used. In the arrangement of FIG. 10B, transistors T10, T10', and T10" are placed in series with transistors T1, T1', and T1", respectively. Transistors T10, T10', and T10" receive the voltage Vint on their respective gates. The during testing voltage Vint is taken to an intermediate voltage (e.g., 0.5 volts). The voltage Vint can be generated using any suitable circuit such as a voltage divider formed from a chain of diode-connected transistors and/or resistors. During normal mode, the voltage Vint is shorted to Vss (0 volts), which fully turns on transistors T10, T10', and T10". In the arrangement of FIG. 10B, transistors T2 and T10 can be medium-thickness-gate-oxide (e.g., 1.6 volt) devices. Transistor T1 can be a thin-oxide (e.g., 1.1 volt) device.

Figure 11:
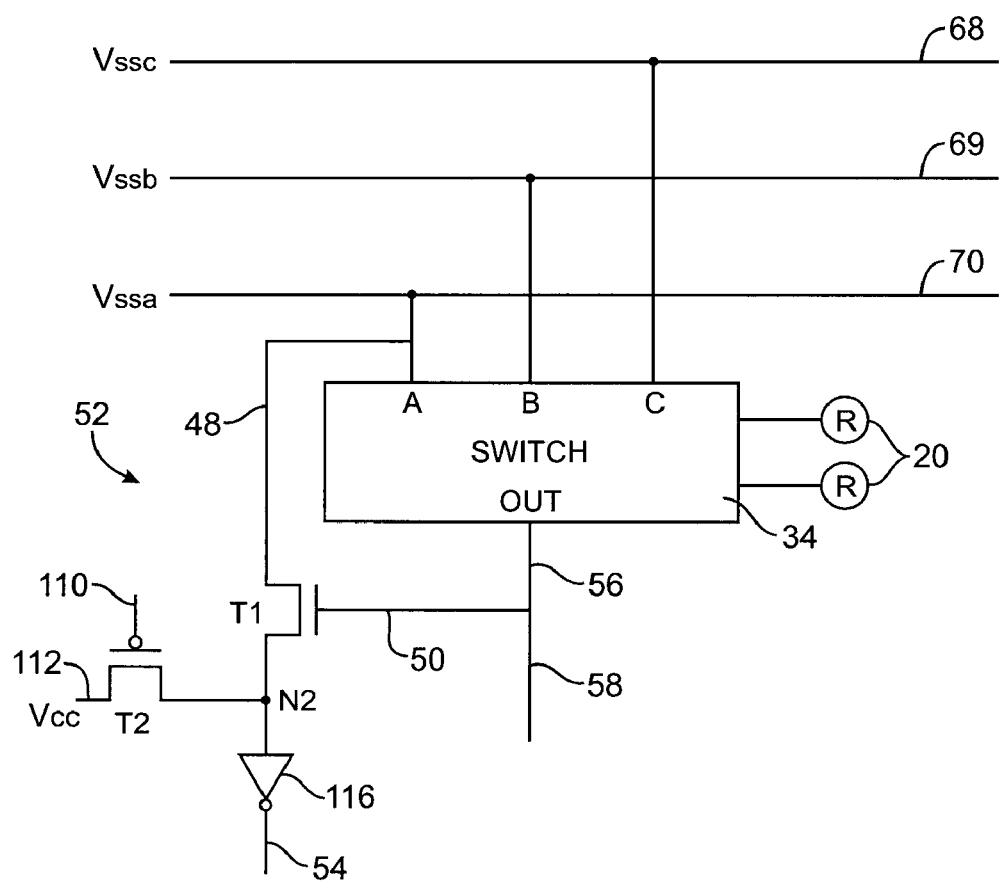
FIG. 11 is a diagram of an illustrative test circuit used to test proper operation of a three-input power supply voltage selection switch on an integrated circuit such as a programmable logic device integrated circuit in accordance with the present invention.

As shown in FIG. 11, power supply voltage selection switches 34 can select between three or more potential power supply voltages such as power supply voltages Vssa, Vssb, and Vssc on respective lines 70, 69, and 68. In the example of FIG. 11, switch 34 is configured using two associated memory elements 20. Switch 34 has three inputs, labeled "A," "B," and "C." During normal operation, one of the three inputs is connected to output 56 and is applied to a circuit block 60 (FIG. 4) via path 58. The voltages Vssa, Vssb, and Vssc may be, for example, 0 volts, −0.5 volts, and −1.0 volts.

To test the proper operation of switch 34, two tests are performed. During the first test, power regulator circuitry 72 (FIG. 4) is used to take Vssa to −1.0 volts, Vssb to 0 volts, and Vssc to −1 volts. The switch 34 is configured so that its B input is connected to output 56. In this configuration, the test circuit 52 compares the −1.0 voltage on input 48 to the voltage on output 56 and line 50. If the switch 34 is functioning properly, the voltage on line 50 will be 0 volts (Vssb), which will turn on transistor T1, taking N2 low and output 54 high.

If the switch 34 is not functioning properly, transistor T1 will not turn on and output 54 will be low. Because line 68 is held at the lowest available voltage (i.e., the same voltage that appears on line 70), the output will not go high, even if line 68 and its voltage Vssc were mistakenly routed to output 56 during the test by a fault in switch 34. A high output voltage can only be obtained when the switch 34 is functioning properly.

After this first test has been completed, a second test is performed. In the second test, input C is tested. The power regulator circuitry 72 takes Vssa to −1.0 volts, Vssb to −1.0 volts, and Vssc to 0 volts. The switch 34 is adjusted so that its C input is connected to output 56. The test circuit 52 compares the −1.0 voltage on input 48 to the voltage on line 50. If the switch 34 is functioning properly, the voltage on line 50 will be 0 volts (i.e., Vssc), which will turn on transistor T1 and take node N2 low. With node N2 low, output 54 will be high. If the switch 34 is not functioning properly, transistor T1 will not turn on and output 54 will be low. Because line 69 is held at 0 volts during the test, the output will not go low, even if the line 69 and its voltage Vssb were mistakenly routed to output 56 (e.g., by a circuit fault within switch 34). As with the first test, a high output voltage during the second test can only be obtained when the switch 34 is functioning properly.

If the first and second tests are completed successfully, it can be concluded that the switch 34 is operating properly.

Figure 12:
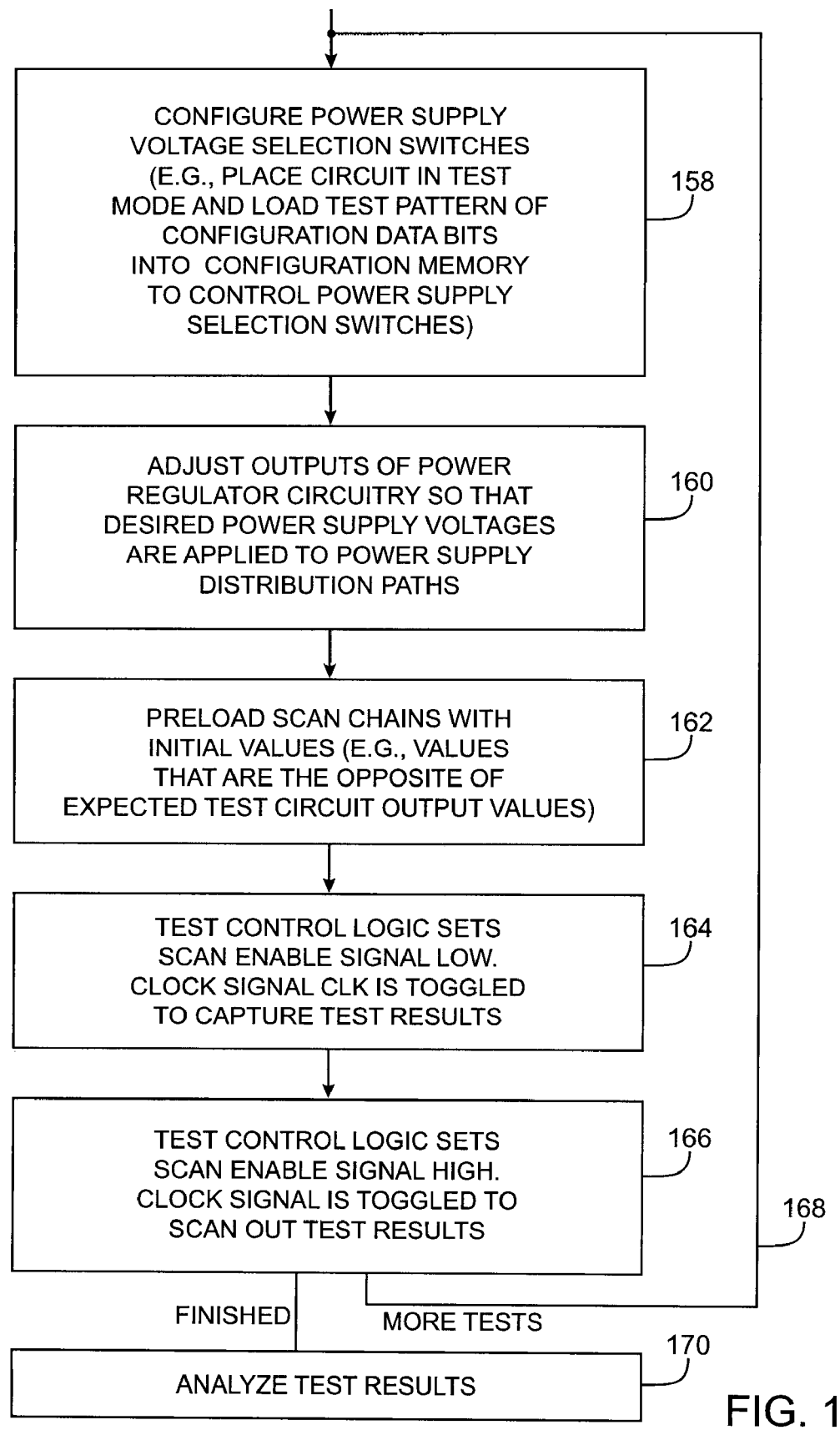
FIG. 12 is a flow chart of illustrative steps involved in using test circuitry to test the operation of power supply selection circuitry on an integrated circuit such as a programmable logic device integrated circuit in accordance with the present invention.

Illustrative steps involved in using the test circuits 52 and other test circuitry of the type shown in FIG. 4 to test the power supply voltage selection switches 34 on a programmable logic device integrated circuit 10 are shown in FIG. 12.

At step 158, the tester 24 places the device under test into test mode. Control signals are applied to switches 34. In general, the control signals may be externally-supplied signals (e.g., from tester 24), internally generated signals (e.g., signals from logic on the integrated circuit 10), or signals generated from a combination of external and internal signals. The control signals may be supplied directly or indirectly from signals provided through an I/O pin 14 or a memory element 20. With a typical scenario, at least some of the switches 34 are configured using control signals applied from memory elements 20. With this type of arrangement, tester 24 loads configuration data into programmable logic device integrated circuit 10 during step 158 via path 26 (FIG. 2), pin 76 (FIG. 4), and configuration memory loading circuitry 78 (FIG. 4). The configuration data is loaded into the programmable memory elements 20 of the device. Once loaded, each programmable element 20 produces an output signal that configures a corresponding portion of programmable logic 18 on the device 10. The programmable memory elements 20 that are used to enable testing (i.e., the memory elements connected to line 120 in circuits such as the circuits of FIGS. 8A, 8B, 10A, and 10B) are loaded with logic ones. The memory elements 20 that are associated with switches 34 are loaded with configuration data that places switches 34 in appropriate states for a test. To produce reliable test results, it may be desirable to test only a subset of the switches 34 on device 10 during each test. Testing fewer switches 34 at a time helps to avoid current peaks and ensures good signal integrity, even if the contacts between the tester probe head and the integrated circuit pins 12 are not optimal.

At step 160, the outputs of the power regulator circuitry 72 are adjusted (e.g., using control signals provided from the tester, using externally-supplied voltages, etc.), so that the lines in the power supply distribution paths 104 have desired voltages. The operations of step 160 may be performed before the operations of step 158, after the operations of step 158, or concurrently with the operations of step 158.

If desired, the registers 86 in the scan chain may be loaded with appropriate initial values at step 162. This can help to ensure that the test measurements can be relied upon. For example, if a switch 34 is being configured to switch a voltage to its output that will result in a logic one being produced by the associated test circuit 52 on output 54, then a logic zero can be preloaded into the appropriate register 86 during step 162. Later, if the state of the register bit is observed to flip during testing, it can be concluded that the logic zero was in fact produced by the test circuit 52 as expected. If a zero had been loaded in the register 86 instead, the test would not have been conclusive.

In the example of FIG. 12, step 162 is performed after step 160. This is merely illustrative. If desired, step 162 can be performed before step 160 and, if appropriate, one or both of these steps can be omitted. For example, if the appropriate voltages are already present on the power supply lines, it is not necessary to make further adjustments to the outputs of the power regulator circuitry 72 at step 160.

At step 164, the test control logic 100 takes the scan enable signal SE on line 102 low. The signal CLK on line 98 is then advanced one cycle. This causes the registers 86 to capture the test data from the test circuits 52 on lines 88.

Following successful test data capture operations at step 164, the test control logic 100 takes the scan enable signal SE high (step 166). The clock signal CLK is then toggled as many times as necessary to ensure that all of the captured test data is shifted out of the scan chain through output pin 94. Tester 24 (FIG. 2) receives the test data results.

If additional subsets of the switches 34 remain to be tested, processing loops back to step 158, as indicated by line 168. Once all desired test results have been gathered, the tester 24 (FIG. 2) may analyze the test data to determine whether the programmable logic device integrated circuit 10 is operating properly (step 170).

Illustrative arrangements for providing control signals to programmable power supply voltage selection switches 34 are shown in FIGS. 13, 14, 15, 16, and 17.

Figure 13:
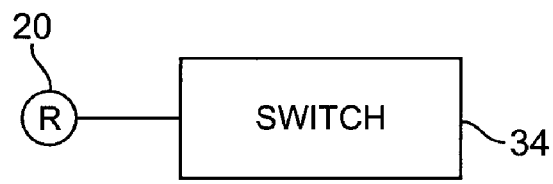
FIGS. 13, 14, 15, 16, and 17 are diagrams of illustrative circuitry for controlling power supply voltage selection switches in accordance with the present invention.

In the arrangement shown in FIG. 13, the state of switch 34 is controlled directly by a static control signal generated from an associated memory element 20. The output of the memory element 20 may be routed to switch 34 using programmable interconnects and/or hardwired interconnects on circuit 10. Circuitry 66 of FIG. 4 uses this type of arrangement.

Figure 14:
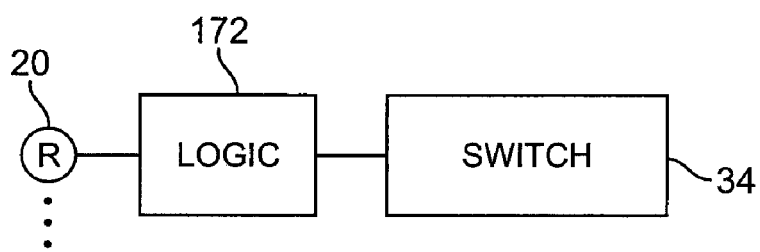

In the arrangement shown in FIG. 14, the state of switch 14 is controlled by a control signal from logic 172. Logic 172 may be formed from programmable logic and/or hardwired logic on integrated circuit 10. Logic 172 may receive static control inputs from one or more programmable elements 20.

Figure 15:
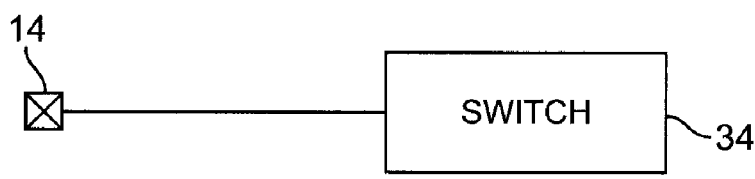

FIG. 15 shows an illustrative arrangement in which a switch 34 is controlled by an external control signal. The external control signal is provided to integrated circuit 10 using an input-output pin 14. The control signal from pin 14 is routed to switch 34 (e.g., using hardwired and/or programmable interconnects).

Figure 16:
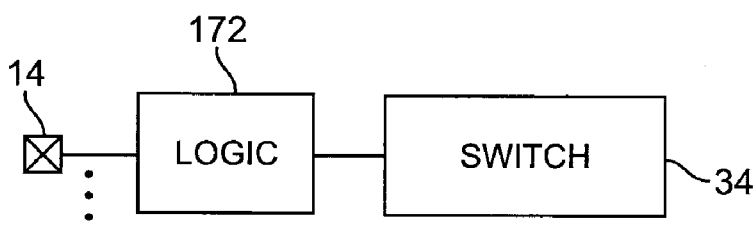

In FIG. 16, switch 34 is controlled by a control signal that is received from logic 172. Logic 172 may generate the control signal from one or more external signals received from one or more associated input-output pins 14.

Figure 17:
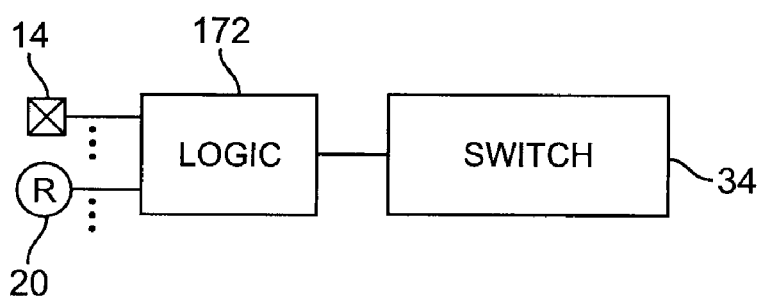

In FIG. 17, switch 34 is controlled by a control signal that is received from logic 172. Logic 172 may receive inputs from one or more input-output pins 14 and one or more programmable elements 20. In a typical scenario, a signal from a pin 14 may be used to place the integrated circuit 10 in test mode. In test mode, logic 172 may generate control signals that selectively turn certain switches 34 on and certain switches off. A test pattern of configuration data is loaded into memory elements 20. Signals from memory elements 20 and/or signals from pins 14 are used to specify which switches 34 are turned on and off.

The foregoing is merely illustrative of the principles of this invention and various modifications can be made by those skilled in the art without departing from the scope and spirit of the invention.

What is claimed is:

1. A method of testing programmable power supply voltage selection switches on a programmable integrated circuit having a plurality of test circuits, each test circuit being associated with a respective one of the programmable power supply voltage selection switches, comprising:

loading a test pattern of configuration data into the programmable integrated circuit that is used in adjusting the programmable power supply voltage selection switches to produce selected voltages at their outputs; and using the test circuits to measure the selected voltages to produce test results, wherein the programmable integrated circuit contains a plurality of power supply voltage distribution lines each having a different associated power supply voltage, each programmable power supply voltage selection switch having inputs connected respectively to the plurality of power supply voltage distribution lines and having an output, wherein each test circuit has a first input connected to one of the plurality of power supply voltage distribution lines and a second input connected to the output of its associated programmable power supply voltage selection switch, and wherein using the test circuits comprises producing the test results by using the test circuits to compare voltages on the first and second inputs.

2. The method defined in claim 1 further comprising using a scan chain of registers to capture the test results.

3. The method defined in claim 1 wherein the programmable integrated circuit comprises a plurality of circuit blocks, wherein a respective one of the selected power supply voltages is provided at the output of each programmable power supply selection switch, and wherein each circuit block receives a respective one of the selected power supply voltages from a different respective one of the programmable power supply voltage selection switches, the method further comprising using a scan chain of registers to capture the test results.

4. A programmable integrated circuit, comprising:

a plurality of circuit blocks;

a plurality of programmable power supply voltage selection switches each of which supplies a selected power supply voltage to an associated one of the circuit blocks;

a plurality of test circuits, each test circuit making performance measurements on a respective associated one of the programmable power supply voltage selection switches and producing a corresponding test result;

a plurality of registers, each register being associated with a respective one of the test circuits and receiving the test result from that test circuit; and a plurality of power supply voltage distribution lines, each having a different associated power supply voltage, wherein each programmable power supply voltage selection switch has inputs connected respectively to the plurality of power supply voltage distribution lines and has an output to which the programmable power supply voltage selection switch connects one of its inputs to provide the selected power supply voltage, wherein each test circuit has a first input, a second input, and an output, and wherein each test circuit produces the test result at its output based on a comparison of voltages on the first and second inputs.

5. The programmable integrated circuit defined in claim 4 wherein the registers are connected to form a scan chain.

6. The programmable integrated circuit defined in claim 4 wherein each test circuit comprises:
a transistor having a first source-drain terminal that receives a power supply voltage from one of the power supply voltage distribution lines, having a gate that receives the selected power supply voltage from the power supply voltage selection switch that is associated with the test circuit, and having a second source-drain terminal that is used in providing the test result to the register associated with the test circuit.

7. The programmable integrated circuit defined in claim 4 wherein each test circuit comprises:
a first transistor having a first source-drain terminal that receives a power supply voltage from one of the power supply voltage distribution lines, having a gate that receives the selected power supply voltage from the power supply voltage selection switch that is associated with the test circuit, and having a second source-drain terminal that is connected to a node and that is used in providing the test result to the register associated with the test circuit; and
a second transistor having a source-drain terminal connected to the node.

8. The programmable integrated circuit defined in claim 4 wherein each test circuit comprises:
a first transistor having a first source-drain terminal that receives a power supply voltage from one of the power supply voltage distribution lines, having a gate that receives the selected power supply voltage from the power supply voltage selection switch that is associated with the test circuit, and having a second source-drain terminal that is connected to a node and that is used in providing the test result to the register associated with the test circuit;
a second transistor having a source-drain terminal connected to the node and having a gate; and
a level shifter having an output connected to the gate of the second transistor.

9. The programmable integrated circuit defined in claim 4 wherein each test circuit comprises:
a transistor having a first source-drain terminal that receives a power supply voltage from one of the power supply voltage distribution lines, having a gate that receives the selected power supply voltage from the power supply voltage selection switch that is associated with the test circuit, and having a second source-drain terminal that is connected to a node; and
a NAND gate having an input connected to the node and having an output, wherein the register associated with the test circuit receives the test result from the output of the NAND gate.

10. The programmable integrated circuit defined in claim 4 wherein each test circuit receives the selected power supply voltage from its associated programmable power supply voltage selection switch and produces its test result by comparing the received selected power supply voltage to one of the power supply voltages.

11. The programmable integrated circuit defined in claim 4 wherein each test circuit comprises a first transistor that makes voltage comparisons, a second transistor that is connected to the first transistor and that has a gate, a programmable memory element having an output, and a level shifter coupled between the programmable memory output and the gate of the second transistor, wherein the level shifter reduces voltages applied to the gate of the second transistor by the programmable memory element.

12. The programmable integrated circuit defined in claim 4 wherein each test circuit comprises a first transistor that makes voltage comparisons, a second transistor that is connected to the first transistor and that has a gate, a programmable memory element having an output connected to the gate of the second transistor, and a level shifter coupled between the programmable memory element output and the gate of the second transistor, wherein the level shifter reduces voltages applied to the gate of the second transistor by the programmable memory element, and wherein each test circuit receives the selected power supply voltage from its associated programmable power supply voltage selection switch and produces its test result by using the first transistor to compare the received selected power supply voltage to one of the power supply voltages.

13. The programmable integrated circuit defined in claim 4 wherein each test circuit comprises a first n-channel transistor that makes voltage comparisons, a second n-channel transistor connected in series with the first transistor, a p-channel transistor that is connected to the second n-channel transistor and that has a gate, and a programmable memory element that produces an output signal, wherein the output signal from the memory element is used in controlling the p-channel transistor.

14. The programmable integrated circuit defined in claim 4 wherein each test circuit comprises a first p-channel transistor that makes voltage comparisons, a second p-channel transistor connected in series with the first transistor, an n-channel transistor that is connected to the second p-channel transistor and that has a gate, and a programmable memory element that produces an output signal, wherein the output signal from the memory element is used in controlling the n-channel transistor.

15. A programmable integrated circuit, comprising:
a plurality of circuit blocks;
a plurality of programmable power supply voltage selection switches each of which supplies a selected power supply voltage to an associated one of the circuit blocks;
a plurality of test circuits, each test circuit making performance measurements on a respective associated one of the programmable power supply voltage selection switches and producing a corresponding test result;
a plurality of registers, each register being associated with a respective one of the test circuits and receiving the test result from that test circuit;
a plurality of power supply voltage distribution lines;
power regulator circuitry that provides a different associated power supply voltage to each of the power supply voltage distribution lines, wherein each programmable power supply voltage selection switch has inputs connected respectively to the plurality of power supply voltage distribution lines and has an output to which the programmable power supply voltage selection switch connects one of its inputs to provide the selected power supply voltage; and
a plurality of programmable interconnection paths, each of which conveys the test result from one of the test circuits to its associated register.

16. The programmable integrated circuit defined in claim 15 further comprising:
test control logic that applies a scan enable signal to the registers, wherein the registers are organized in a scan chain with which the test results from the test circuits are captured during testing of the programmable power supply voltage switches.

17. A programmable integrated circuit, comprising:

a plurality of circuit blocks;

a plurality of programmable power supply voltage selection switches each of which supplies a selected power supply voltage to an associated one of the circuit blocks;

a plurality of test circuits, each test circuit making performance measurements on a respective associated one of the programmable power supply voltage selection switches and producing a corresponding test result;

a plurality of registers, each register being associated with a respective one of the test circuits and receiving the test result from that test circuit; and a plurality of programmable memory elements, each programmable power supply voltage selection switch being controlled by output signals from at least one of the programmable memory elements, wherein each circuit block contains metal-oxide-semiconductor transistors that are provided with the selected power supply voltage from a respective one of the programmable power supply voltage selection switches.

* * * * *